United States Patent
Takata et al.

(10) Patent No.: US 12,404,450 B2
(45) Date of Patent: Sep. 2, 2025

(54) PHOTODETECTOR ELEMENT, MANUFACTURING METHOD FOR PHOTODETECTOR ELEMENT, IMAGE SENSOR, DISPERSION LIQUID, AND SEMICONDUCTOR FILM

(71) Applicant: FUJIFILM Corporation, Tokyo (JP)

(72) Inventors: Masahiro Takata, Kanagawa (JP); Masashi Ono, Kanagawa (JP); Shunsuke Kitajima, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 700 days.

(21) Appl. No.: 17/555,519

(22) Filed: Dec. 20, 2021

(65) Prior Publication Data

US 2022/0115610 A1 Apr. 14, 2022

Related U.S. Application Data

(63) Continuation of application No. PCT/JP2020/019470, filed on May 15, 2020.

(30) Foreign Application Priority Data

Jul. 1, 2019 (JP) .................. 2019-123102

(51) Int. Cl.
| | |
|---|---|
| *H10K 30/35* | (2023.01) |
| *C09K 11/02* | (2006.01) |
| *C09K 11/66* | (2006.01) |
| *H10K 39/32* | (2023.01) |
| *B82Y 15/00* | (2011.01) |

(52) U.S. Cl.
CPC ............ *C09K 11/02* (2013.01); *C09K 11/661* (2013.01); *H10K 30/35* (2023.02); *H10K 39/32* (2023.02); *B82Y 15/00* (2013.01); *H10K 30/352* (2023.02)

(58) Field of Classification Search
CPC ...... C09K 11/02; C09K 11/661; H10K 39/32; H10K 30/35; H10K 30/352; H01L 31/10; H01L 31/0264; B82Y 20/00; B82Y 15/00; Y02E 10/549
USPC ........................................... 257/40
See application file for complete search history.

(56) References Cited

U.S. PATENT DOCUMENTS

| | | |
|---|---|---|
| 2015/0372046 A1 | 12/2015 | Kim et al. |
| 2016/0211392 A1 | 7/2016 | So et al. |
| 2017/0271604 A1 | 9/2017 | Brown et al. |
| 2017/0301481 A1* | 10/2017 | Chang ............. H01G 9/2059 |
| 2019/0006541 A1 | 1/2019 | So et al. |

(Continued)

FOREIGN PATENT DOCUMENTS

| | | |
|---|---|---|
| CN | 109148695 | 1/2019 |
| JP | 2016513361 | 5/2016 |
| JP | 2016532301 | 10/2016 |
| JP | 2017516320 | 6/2017 |
| JP | 2018529214 | 10/2018 |
| KR | 20110002694 | 1/2011 |

(Continued)

OTHER PUBLICATIONS

Merriam-Webster OnLine definition of Photdiode. No Date!*

(Continued)

*Primary Examiner* — Nathan W Ha
(74) *Attorney, Agent, or Firm* — JCIPRNET

(57) ABSTRACT

A photodetector element contains aggregates of PbS quantum dots and a ligand that is coordinated to the PbS quantum dot, in which the PbS quantum dot contains more than 0 mol and 1.40 mol or less of a Pb atom with respect to 1 mol of a S atom.

18 Claims, 1 Drawing Sheet

(56) References Cited

U.S. PATENT DOCUMENTS

2019/0129302 A1 5/2019 Youn et al.
2019/0229279 A1 7/2019 Takizawa et al.
2020/0308017 A1 10/2020 Cheng et al.
2021/0388161 A1* 12/2021 Culbertson ...... C08G 65/33337

FOREIGN PATENT DOCUMENTS

WO 2018016213 1/2018
WO WO-2018020240 A1 * 2/2018

OTHER PUBLICATIONS

"Trap-State Suppression and Improved Charge Transport in PbS Quantum Dot Solar Cells with Synergistic MixedLigand Treatments," by Santanu Pradhan et al., Advanced Science News, 1700590, pp. 1-9 (2017).*
Office Action of Japan Counterpart Application, with English translation thereof, issued on Aug. 30, 2022, pp. 1-5.
E. Veena et al., "Influence of Lead Precursor Concentration on Properties of Spray Deposited Lead Sulphide Thin Films," International Journal of Pure and Applied Physics, vol. 12, 2016, pp. 97-112.
"International Search Report (Form PCT/ISA/210) of PCT/JP2020/019470," mailed on Jul. 21, 2020, with English translation thereof, pp. 1-5.
"Written Opinion of the International Searching Authority (Form PCT/ISA/237)" of PCT/JP2020/019470, mailed on Jul. 21, 2020, with English translation thereof, pp. 1-6.
Office Action of Japan Counterpart Application, with English translation thereof, issued on Dec. 20, 2022, pp. 1-5.

* cited by examiner

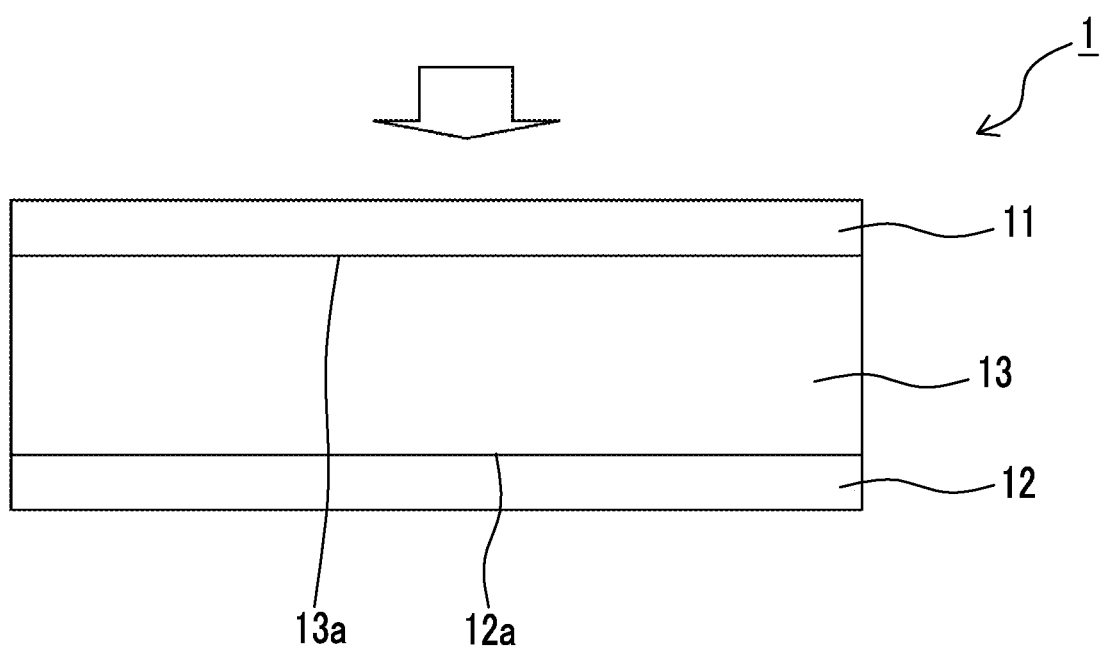

PHOTODETECTOR ELEMENT, MANUFACTURING METHOD FOR PHOTODETECTOR ELEMENT, IMAGE SENSOR, DISPERSION LIQUID, AND SEMICONDUCTOR FILM

CROSS-REFERENCE TO RELATED APPLICATIONS

This application is a Continuation of PCT International Application No. PCT/JP2020/019470 filed on May 15, 2020, which claims priority under 35 U.S.C. § 119(a) to Japanese Patent Application No. 2019-123102 filed on Jul. 1, 2019. Each of the above application(s) is hereby expressly incorporated by reference, in its entirety, into the present application.

BACKGROUND OF THE INVENTION

1. Field of the Invention

The present invention relates to a photodetector element having a photoelectric conversion layer that contains PbS quantum dots, a manufacturing method for a photodetector element, and an image sensor. In addition, the present invention also relates to a dispersion liquid that contains PbS quantum dots, and a semiconductor film.

2. Description of the Related Art

In recent years, attention has been focused on photodetector elements capable of detecting light in the infrared region in the fields such as smartphones, surveillance cameras, and in-vehicle cameras.

In the related art, a silicon photodiode in which a silicon wafer is used as a material of a photoelectric conversion layer has been used in a photodetector element that is used in an image sensor or the like. However, a silicon photodiode has low sensitivity in the infrared region having a wavelength of 900 nm or more.

In addition, an InGaAs-based semiconductor material known as a near-infrared light-receiving element has a problem in that it requires extremely high-cost processes such as epitaxial growth for achieving high quantum efficiency, and thus it has not been widespread.

By the way, in recent years, research on semiconductor quantum dots has been advanced. For example, JP2016-532301A describes an invention relating to a photodetector using PbS quantum dots as a photoactive layer.

SUMMARY OF THE INVENTION

In recent years, with the demand for performance improvement of an image sensor the like, further improvement of various characteristics that is required in a photodetector element used in the image sensor the like is also required. For example, it is required to further reduce the dark current of the photodetector element. In a case where the dark current of the photodetector element is reduced, a higher signal-to-noise ratio (SN ratio) can be obtained in the image sensor.

According to the study of the inventors of the present invention, it was found that the photodetector element having a photoelectric conversion layer formed of semiconductor quantum dots tended to have a relatively high dark current, and there was room for reducing the dark current. Here, the dark current is a current that flows in a case of not being irradiated with light.

An object of the present invention is to provide a photodetector element in which the dark current is reduced, a manufacturing method for a photodetector element, and an image sensor. In addition, another object of the present invention is to provide a dispersion liquid and a semiconductor film which are used in a photodetector element or the like, in which the dark current is reduced.

According to the study of the inventors of the present invention, it has been found that the above problems can be solved by adopting the following configurations, and the present invention has been completed. The present invention provides the following.

<1> A photodetector element comprising a photoelectric conversion layer that contains aggregates of PbS quantum dots and a ligand that is coordinated to the PbS quantum dot,
in which the PbS quantum dot contains more than 0 mol and 1.40 mol or less of a Pb atom with respect to 1 mol of a S atom.
<2> The photodetector element according to <1>, in which the PbS quantum dot contains 0.95 mol or more and 1.40 mol or less of the Pb atom with respect to 1 mol of the S atom.
<3> The photodetector element according to <1> or <2>, in which the ligand contains at least one selected from a ligand containing a halogen atom or a polydentate ligand containing two or more coordination moieties.
<4> The photodetector element according to <3>, in which the ligand containing a halogen atom is an inorganic halide.
<5> The photodetector element according to <4>, in which the inorganic halide contains a Zn atom.
<6> The photodetector element according to any one of <3> to <5>, in which the ligand containing a halogen atom contains an iodine atom.
<7> The photodetector element according to any one of <1> to <6>, in which the ligand contains at least one selected from 3-mercaptopropionic acid, zinc iodide, zinc bromide, or indium iodide.
<8> The photodetector element according to any one of <1> to <7>, in which the ligand contains two or more kinds of ligands.
<9> The photodetector element according to any one of <1> to <8>, in which the ligand contains a ligand containing a halogen atom and a polydentate ligand containing two or more coordination moieties.
<10> The photodetector element according to any one of <1> to <9>, in which the photodetector element is a photodiode-type photodetector element.
<11> A manufacturing method for the photodetector element according to any one of <1> to <10>, the manufacturing method comprising:
a step of using a dispersion liquid that contains PbS quantum dots that contain more than 0 mol and 1.40 mol or less of a Pb atom with respect to 1 mol of a S atom, a ligand that is coordinated to the PbS quantum dot, and a solvent, to form a film of aggregates of PbS quantum dots.
<12> An image sensor comprising the photodetector element according to any one of <1> to <10>.
<13> The image sensor according to <12>, in which the image sensor senses light having a wavelength of 900 to 1,600 nm.

<14> The image sensor according to <12>, in which the image sensor is an infrared image sensor.

<15> A dispersion liquid comprising: PbS quantum dots that contain more than 0 mol and 1.40 mol or less of a Pb atom with respect to 1 mol of a S atom; a ligand that is coordinated to the PbS quantum dot; and a solvent.

<16> A semiconductor film comprising aggregates of PbS quantum dots and a ligand that is coordinated to the PbS quantum dot, in which the PbS quantum dot contains more than 0 mol and 1.40 mol or less of a Pb atom with respect to 1 mol of a S atom.

<17> The semiconductor film according to <16>, in which the PbS quantum dot contains 0.95 mol or more and 1.40 mol or less of the Pb atom with respect to 1 mol of the S atom.

According to the present invention, it is possible to provide a photodetector element in which the dark current is reduced, a manufacturing method for a photodetector element, and an image sensor. In addition, it is possible to provide a dispersion liquid and a semiconductor film.

BRIEF DESCRIPTION OF THE DRAWINGS

FIG. 1 is a diagram illustrating an embodiment of a photodetector element.

DESCRIPTION OF THE PREFERRED EMBODIMENTS

Hereinafter, the contents of the present invention will be described in detail.

In the present specification, "to" is used to mean that numerical values described before and after "to" are included as a lower limit value and an upper limit value, respectively.

In describing a group (an atomic group) in the present specification, in a case where a description about substitution and non-substitution is not provided, the description means the group includes a group (an atomic group) having a substituent as well as a group (an atomic group) having no substituent. For example, the "alkyl group" includes not only an alkyl group that does not have a substituent (an unsubstituted alkyl group) but also an alkyl group that has a substituent (a substituted alkyl group).

<Photodetector Element>

The photodetector element according to the embodiment of the present invention is characterized the following:

it is a photodetector element having a photoelectric conversion layer that contains aggregates of PbS quantum dots and a ligand that is coordinated to the PbS quantum dot, in which the PbS quantum dot contains more than 0 mol and 1.40 mol or less of a Pb atom with respect to 1 mol of a S atom.

According to the present invention, it is possible to obtain a photodetector element having a reduced dark current. The detailed reason why such effects are obtained is unknown; however, it is presumed to be due to the following. That is, it is presumed that since this PbS quantum dot contains more than 0 mol and 1.40 mol or less of a Pb atom with respect to 1 mol of a S atom, the ratio of the S atom in the PbS quantum dot is relatively high, and thus the PbS quantum dot function like a p-type semiconductor. As a result, it is presumed that the number of free electrons in the photoelectric conversion layer is reduced and thus the dark current can be reduced.

The PbS quantum dot preferably contains 0.30 mol or more and 1.40 mol or less of a Pb atom, more preferably 0.50 mol or more and 1.40 mol or less, and due to the reason that a photodetector element having an excellent external quantum efficiency and a reduced dark current is easily obtained, still more preferably contains 0.95 mol or more and 1.40 mol or less with respect to 1 mol of a S atom. The molar ratio of the S atom to the Pb atom in the PbS quantum dot can be calculated by quantifying the Pb atom and the S atom in the PbS quantum dot by an inductively coupled plasma (ICP) emission spectroscopic analysis. In a case of evaluating the Pb/S ratio of the PbS quantum dot containing a Pb atom or a S atom in the ligand, the PbS quantum dots are immersed in a large excess of methanol to remove the ligand from the PbS quantum dots, and then the Pb atom and the S atom in the PbS quantum dots are quantified and calculated by the ICP emission spectroscopic analysis. The removal of the ligand from the PbS quantum dots can be confirmed by the fact that the Pb/S ratio of the PbS quantum dots does not change in a case where the immersion time in methanol is changed.

In the present specification, the aggregate of PbS quantum dots means a form in which a large number of PbS quantum dots (for example, 100 or more quantum dots per 1 μm$^2$ square) are arranged close to each other.

The PbS quantum dot that is used in the present invention is composed of PbS particles.

The band gap of the PbS quantum dot is preferably 0.5 to 2.0 eV. In a case where the band gap of the PbS quantum dot is within the above range, it is possible to obtain a photodetector element capable of detecting light of various wavelengths depending on the use application. For example, it is possible to obtain a photodetector element capable of detecting light in the infrared region. The upper limit of the band gap of the PbS quantum dot is preferably 1.9 eV or less, more preferably 1.8 eV or less, and still more preferably 1.5 eV or less. The lower limit of the band gap of the PbS quantum dot is preferably 0.6 eV or more and more preferably 0.7 eV or more.

The average particle diameter of PbS quantum dots is preferably 2 nm to 15 nm. The average particle diameter of PbS quantum dots refers to the average particle diameter of ten PbS quantum dots. A transmission electron microscope may be used for measuring the particle diameter of PbS quantum dots.

Generally, a PbS quantum dot contains particles of various sizes from several nm to several tens of nm. In the PbS quantum dot, in a case where the average particle diameter of PbS quantum dots is reduced to a size equal to or smaller than the Bohr radius of the internal electrons, a phenomenon in which the band gap of the PbS quantum dot changes due to the quantum size effect occurs. In a case where the average particle diameter of PbS quantum dots is 15 nm or less, it is easy to control the band gap by the quantum size effect.

The photoelectric conversion layer of the photodetector element contains a ligand that is coordinated to the PbS quantum dot. Examples of the ligand include a ligand containing a halogen atom and a polydentate ligand containing two or more coordination moieties. The photoelectric conversion layer may contain only one kind of ligand or may contain two or more kinds of ligands. Among the above, the photoelectric conversion layer preferably contains a ligand containing a halogen atom and a polydentate ligand.

In a case where a ligand containing a halogen atom is used, the surface coverage of the PbS quantum dot by the ligand can be easily increased, and as a result, higher external quantum efficiency can be obtained.

In a case where a polydentate ligand is used, the polydentate ligand is easily subjected to chelate coordination to the PbS quantum dot, and the peeling of the ligand from the PbS quantum dot can be suppressed more effectively, whereby excellent durability is obtained. Furthermore, in a case of being subjected to chelate coordination, steric hindrance between PbS quantum dots can be suppressed, and high electrical conductivity is easily obtained, whereby high external quantum efficiency is obtained.

In addition, in a case where a ligand containing a halogen atom and a polydentate ligand are used in combination, a higher external quantum efficiency is easily obtained. As described above, the polydentate ligand is presumed to be subjected to chelate coordination to the PbS quantum dot. Furthermore, in a case where a ligand containing a halogen atom is further contained as the ligand that is coordinated to the PbS quantum dot, it is presumed that the ligand containing a halogen atom is coordinated in the gap where the polydentate ligand is not coordinated, and thus it is presumed that the surface defects of the PbS quantum dot can be further reduced. As a result, it is presumed that the external quantum efficiency of the photodetector element can be further improved.

First, the ligand containing a halogen atom will be described. Examples of the halogen atom contained in the ligand containing a halogen atom include a fluorine atom, a chlorine atom, a bromine atom, and an iodine atom, and an iodine atom is preferable from the viewpoint of coordinating power.

The ligand containing a halogen atom may be an organic halide or may be an inorganic halide. Among the above, an inorganic halide is preferable due to the reason that it is easily coordinated to both the cation site and the anion site of the PbS quantum dot. In addition, the inorganic halide is preferably a compound containing a metal atom selected from a Zn atom, an In atom, and a Cd atom, and it is more preferably a compound containing a Zn atom. The inorganic halide is preferably a salt of a metal atom and a halogen atom due to the reason that the salt is easily ionized and easily coordinated to the PbS quantum dot.

Specific examples of the ligand containing a halogen atom include zinc iodide, zinc bromide, zinc chloride, indium iodide, indium bromide, indium chloride, cadmium iodide, cadmium bromide, and cadmium chloride, and zinc iodide is particularly preferable.

In the ligand containing a halogen atom, the halogen ion may be dissociated from the ligand containing a halogen atom, and the halogen ion may be coordinated on the surface of the PbS quantum dot. In addition, a portion of the ligand containing a halogen atom other than the halogen, may also be coordinated on the surface of the PbS quantum dot. To describe with a specific example, in the case of zinc iodide, zinc iodide may be coordinated on the surface of PbS quantum dot, or the iodine ion or the zinc ion may be coordinated on the surface of PbS quantum dot.

Next, the polydentate ligand will be described. Examples of the coordination moiety contained in the polydentate ligand include a thiol group, an amino group, a hydroxy group, a carboxy group, a sulfo group, a phospho group, and a phosphonic acid group. The polydentate ligand is preferably a compound containing a thiol group due to the reason that the compound is easily coordinated firmly on the surface of the PbS quantum dot (preferably, to the Pb atom of the PbS quantum dot).

Examples of the polydentate ligand include a ligand represented by any one of Formulae (A) to (C).

In Formula (A), $X^{A1}$ and $X^{A2}$ each independently represent a thiol group, an amino group, a hydroxy group, a carboxy group, a sulfo group, a phospho group, or a phosphonic acid group.

$L^{A1}$ represents a hydrocarbon group.

In Formula (B), $X^{B1}$ and $X^{B2}$ each independently represent a thiol group, an amino group, a hydroxy group, a carboxy group, a sulfo group, a phospho group, or a phosphonic acid group.

$X^{B3}$ represents S, O, or NH.

$L^{B1}$ and $L^{B2}$ each independently represent a hydrocarbon group.

In Formula (C), $X^{C1}$ to $X^{C3}$ each independently represent a thiol group, an amino group, a hydroxy group, a carboxy group, a sulfo group, a phospho group, or a phosphonic acid group.

$X^{C4}$ represents N.

$L^{C1}$ to $L^{C3}$ each independently represent a hydrocarbon group.

The amino group represented by $X^{A1}$, $X^{A2}$, $X^{B1}$, $X^{B2}$, $X^{C1}$, $X^{C2}$, or $X^{C3}$ is not limited to $-NH_2$ and includes a substituted amino group and a cyclic amino group as well. Examples of the substituted amino group include a monoalkylamino group, a dialkylamino group, a monoarylamino group, a diarylamino group, and an alkylarylamino group. The amino group represented by these groups is preferably $-NH_2$, a monoalkylamino group, or a dialkylamino group, and $-NH_2$ is more preferable.

The hydrocarbon group represented by $L^{A1}$, $L^{B1}$, $L^{B2}$, $L^{C1}$, $L^{C2}$, or $L^{C3}$ is preferably an aliphatic hydrocarbon group. The aliphatic hydrocarbon group may be a saturated aliphatic hydrocarbon group or may be an unsaturated aliphatic hydrocarbon group. The hydrocarbon group preferably has 1 to 20 carbon atoms. The upper limit of the number of carbon atoms is preferably 10 or less, more preferably 6 or less, and still more preferably 3 or less. Specific examples of the hydrocarbon group include an alkylene group, an alkenylene group, and an alkynylene group.

Examples of the alkylene group include a linear alkylene group, a branched alkylene group, and a cyclic alkylene group. A linear alkylene group or a branched alkylene group is preferable, and a linear alkylene group is more preferable. Examples of the alkenylene group include a linear alkenylene group, a branched alkenylene group, and a cyclic alkenylene group. A linear alkenylene group or a branched alkenylene group is preferable, and a linear alkenylene group is more preferable. Examples of the alkynylene group include a linear alkynylene group and a branched alkynylene group, and a linear alkynylene group is preferable. The alkylene group, the alkenylene group, and the alkynylene group may further have a substituent. The substituent is preferably a group having 1 or more and 10 or less atoms. Preferred specific examples of the group having 1 to 10 atoms include an alkyl group having 1 to 3 carbon atoms [a methyl group, an ethyl group, a propyl group, or an isopropyl group], an alkenyl group having 2 or 3 carbon atoms [an ethenyl group or a propenyl group], an alkynyl group having 2 to 4 carbon atoms [an ethynyl group, a propynyl group, or the like], a cyclopropyl group, an alkoxy group having 1 or 2 carbon atoms [a methoxy group or an ethoxy group], an acyl group having 2 or 3 carbon atoms [an acetyl group or a propionyl group], an alkoxycarbonyl group having 2 or 3 carbon atoms [a methoxycarbonyl group or an ethoxycarbonyl group], an acyloxy group having 2 carbon atoms [an acetyloxy group], an acylamino group having 2 carbon atoms [an acetylamino group], a hydroxyalkyl group having 1 to 3 carbon atoms [a hydroxymethyl group, a hydroxyethyl group, or a hydroxypropyl group], an aldehyde group, a hydroxy group, a carboxy group, a sulfo group, a phospho group, a carbamoyl group, a cyano group, an isocyanate group, a thiol group, a nitro group, a nitroxy group, an isothiocyanate group, a cyanate group, a thiocyanate group, an acetoxy group, an acetamide group, a formyl group, a formyloxy group, a formamide group, a sulfamino group, a sulfino group, a sulfamoyl group, a phosphono group, an acetyl group, a halogen atom, and an alkali metal atom.

In Formula (A), $X^{A1}$ and $X^{A2}$ are separated by $L^{A1}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms.

In Formula (B), $X^{B1}$ and $X^{B3}$ are separated by $L^{B1}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms. In addition, $X^{B2}$ and $X^{B3}$ are separated by $L^{B2}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms.

In Formula (C), $X^{C1}$ and $X^{C4}$ are separated by $L^{C1}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms. In addition, $X^{C2}$ and $X^{C4}$ are separated by $L^{C2}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms. In addition, $X^{C3}$ and $X^{C4}$ are separated by $L^{C3}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms.

It is noted that the description that $X^{A1}$ and $X^{A2}$ are separated by $L^{A1}$ by 1 to 10 atoms means that the number of atoms that constitute the shortest molecular chain connecting $X^{A1}$ and $X^{A2}$ is 1 to 10 atoms. For example, in a case of Formula (A1), $X^{A1}$ and $X^{A2}$ are separated by two atoms, and in cases of Formulae (A2) and (A3), $X^{A1}$ and $X^{A2}$ are separated by 3 atoms. The numbers added to the following structural formulae represent the arrangement order of atoms constituting the shortest distance molecular chain connecting $X^{A1}$ and $X^{A2}$.

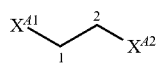

(A1)

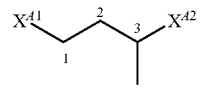

(A2)

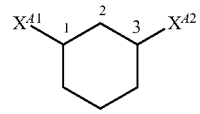

(A3)

To describe with a specific compound, 3-mercaptopropionic acid is a compound (a compound having the following structure) having a structure in which a portion corresponding to $X^{A1}$ is a carboxy group, a portion corresponding to $X^{A2}$ is a thiol group, and a portion corresponding to $L^{A1}$ is an ethylene group. In 3-mercaptopropionic acid, $X^{A1}$ (the carboxy group) and $X^{A2}$ (the thiol group) are separated by $L^{A1}$ (the ethylene group) by two atoms.

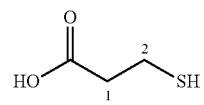

The same applies to the meanings that $X^{B1}$ and $X^{B3}$ are separated by $L^{B1}$ by 1 to 10 atoms, $X^{B2}$ and $X^{B3}$ are separated by $L^{B2}$ by 1 to 10 atoms, $X^{C1}$ and $X^{C4}$ are separated by $L^{C1}$ by 1 to 10 atoms, $X^{C2}$ and $X^{C4}$ are separated by $L^{C2}$ by 1 to 10 atoms, and $X^{C3}$ and $X^{C4}$ are separated by $L^{C3}$ by 1 to 10 atoms.

Specific examples of the polydentate ligand include 3-mercaptopropionic acid, thioglycolic acid, 2-aminoethanol, 2-aminoethanethiol, 2-mercaptoethanol, glycolic acid, ethylene glycol, ethylenediamine, aminosulfonic acid, glycine, aminomethylphosphoric acid, guanidine, diethylenetriamine, tris(2-aminoethyl)amine, 4-mercaptobutanoic acid, 3-aminopropanol, 3-mercaptopropanol, N-(3-aminopropyl)-1,3-propanediamine, 3-(bis(3-aminopropyl)amino)propan-1-ol, 1-thioglycerol, dimercaprol, 1-mercapto-2-butanol, 1-mercapto-2-pentanol, 3-mercapto-1-propanol, 2,3-dimercapto-1-propanol, diethanolamine, 2-(2-aminoethyl)aminoethanol, dimethylenetriamine, 1,1-oxybismethylamine, 1,1-thiobismethylamine, 2-[(2-aminoethyl)amino]ethanethiol, bis(2-mercaptoethyl)amine, 2-aminoethane-1-thiol, 1-amino-2-butanol, 1-amino-2-pentanol, L-cysteine, D-cysteine, 3-amino-1-propanol, L-homoserine, D-homoserine, aminohydroxyacetic acid, L-lactic acid, D-lactic acid, L-malic acid, D-malic acid, glyceric acid, 2-hydroxybutyric acid, L-tartaric acid, D-tartaric acid, tartronic acid, and derivatives thereof.

As the polydentate ligand, a compound in which the complex stability constant K1 between the polydentate ligand and the Pb atom of the PbS quantum dot is 6 or more is preferably used. The complex stability constant K1 of the polydentate ligand is more preferably 8 or more and still more preferably 10 or more. In a case where the complex stability constant K1 between the polydentate ligand and the Pb atom of the PbS quantum dot is 6 or more, the strength of the bond between the PbS quantum dot and the polydentate ligand can be increased.

The complex stability constant K1 is a constant determined by the relationship between a ligand and a metal atom which is a target of the coordinate bond, and it is represented by Expression (b).

Complex stability constant $K1=[ML]/([M]\times[L])$     (b)

In Expression (b), [ML] represents the molar concentration of a complex formed by bonding a metal atom to a ligand, [M] represents the molar concentration of a metal atom contributing to the coordinate bond, and [L] represents the molar concentration of the ligand.

Practically, a plurality of ligands may be coordinated to one metal atom. However, in the present invention, the complex stability constant K1 represented by Expression (b) in a case where one ligand molecule is coordinated to one metal atom is defined as an indicator of the strength of the coordinate bond.

The complex stability constant K1 between the ligand and the metal atom can be determined by spectroscopy, magnetic resonance spectroscopy, potentiometry, solubility measurement, chromatography, calorimetry, solidifying point measurement, vapor pressure measurement, relaxation measurement, viscosity measurement, surface tension measurement, or the like. In the present invention, the complex stability constant K1 is determined using Sc-Database ver. 5.85 (Academic Software) (2010), which summarizes results from various methods and research institutes. In a case where the complex stability constant K1 is not present in the Sc-Database ver. 5.85, a value described in Critical Stability Constants, written by A. E. Martell and R. M. M. Smith, is used. In a case where the complex stability constant K1 is not described in the Critical Stability Constants, the above-described measurement method is used or a program PKAS method that calculates the complex stability constant K1 (The Determination and Use of Stability Constants, VCH (1988) written by A. E. Martell et. al.) is used to calculate the complex stability constant K1.

The photoelectric conversion layer that contains aggregates of PbS quantum dots and a ligand that is coordinated to the PbS quantum dot is preferably formed by applying, onto a substrate, a dispersion liquid containing PbS quantum dots that contain more than 0 mol and 1.40 mol or less of a Pb atom with respect to 1 mol of a S atom, a ligand that is coordinated to the PbS quantum dot, and a solvent, and causes the substrate to undergo a step of forming a film of aggregates of PbS quantum dots (a step of forming aggregates of PbS quantum dots). That is, the manufacturing method for a photodetector element according to the embodiment of the present invention preferably includes a step of using a dispersion liquid that contains PbS quantum dots that contain more than 0 mol and 1.40 mol or less of a Pb atom with respect to 1 mol of a S atom, a ligand that is coordinated to the PbS quantum dot, and a solvent, to form a film of aggregates of PbS quantum dots.

The method for applying a dispersion liquid onto a substrate is not particularly limited. Examples thereof include coating methods such as a spin coating method, a dipping method, an inkjet method, a dispenser method, a screen printing method, a relief printing method, an intaglio printing method, and a spray coating method.

In addition, after forming a film of aggregates of PbS quantum dots, a ligand exchange step may be further carried out to exchange the ligand coordinated to the PbS quantum dot with another ligand. In the ligand exchange step, a ligand solution containing a ligand A and a solvent is applied onto the film of aggregates of PbS quantum dots, formed by the step of forming aggregates of PbS quantum dots, to exchange the ligand coordinated to the PbS quantum dot with the ligand A. The ligand A may contain two or more kinds of ligands, and two kinds of ligand solutions may be used in combination. Examples of the ligand A include the ligand containing a halogen atom and the polydentate ligand containing two or more coordination moieties, which are described above.

On the other hand, a desired ligand may be applied onto the surface of the PbS quantum dot in advance in the dispersion liquid, and this dispersion liquid may be applied onto the substrate to form a photoelectric conversion layer.

The content of the PbS quantum dot in the dispersion liquid is preferably 1 to 500 mg/mL, more preferably 10 to 200 mg/mL, and still more preferably 20 to 100 mg/mL.

Examples of the solvent contained in the dispersion liquid and the ligand solution include an ester-based solvent, a ketone-based solvent, an alcohol-based solvent, an amide-based solvent, an ether-based solvent, and a hydrocarbon-based solvent. For details thereof, paragraph No. 0223 of WO2015/166779A can be referenced, the content of which is incorporated in the present specification. In addition, an ester-based solvent substituted with a cyclic alkyl group and a ketone-based solvent substituted with a cyclic alkyl group can also be used. It is preferable that the solvent has a small amount of metal impurities, and the metal content is, for example, 10 ppb (parts per billion) by mass or less. A solvent of a level of ppt (parts per trillion) by mass may be used as necessary, and such a solvent is provided by, for example, TOAGOSEI Co., Ltd. (The Chemical Daily, Nov. 13, 2015). Examples of the method for removing impurities such as metals from the solvent include distillation (molecular distillation, thin film distillation, and the like) and filtration using a filter. The filter pore diameter of the filter that is used for filtration is preferably 10 μm or less, more preferably 5 μm or less, and still more preferably 3 μm or less. A material of the filter is preferably polytetrafluoroethylene, polyethylene, or nylon. The solvent may contain isomers (compounds having the same number of atoms but having different structures). In addition, only one kind of isomer may be contained, or a plurality of kinds thereof may be contained.

The thickness of the photoelectric conversion layer of the photodetector element is preferably 10 to 600 nm, more preferably 50 to 600 nm, still more preferably 100 to 600 nm, and even still more preferably 150 to 600 nm. The upper limit of the thickness is preferably 550 nm or less, more preferably 500 nm or less, and still more preferably 450 nm or less.

The refractive index of the photoelectric conversion layer with respect to light of the target wavelength to be detected by the photodetector element is preferably 2.0 to 3.0, more preferably 2.1 to 2.8, and still more preferably 2.2 to 2.7. According to this aspect, in a case where the configuration of the photodetector element is a photodiode, it is easy to realize a high light absorbance, that is, a high external quantum efficiency.

Since the photodetector element according to the embodiment of the present invention has excellent sensitivity to light having a wavelength in the infrared region, it is preferable to detect light having a wavelength in the infrared region. That is, the photodetector element according to the embodiment of the present invention is preferably an infrared photodetector element. In addition, the target light to be detected by the above-described photodetector element is preferably light having a wavelength in the infrared region. In addition, the light having a wavelength in the infrared region is preferably light having a wavelength of more than 700 nm, more preferably light having a wavelength of 800 nm or more, and still more preferably light having a wavelength of 900 nm or more. In addition, the light having a wavelength in the infrared region is preferably light having a wavelength of 2,000 nm or less and more preferably light having a wavelength of 1,600 nm or less.

In addition, the photodetector element according to the embodiment of the present invention may simultaneously detect light having a wavelength in the infrared region and light having a wavelength in the visible region (preferably light having a wavelength in a range of 400 to 700 nm).

Examples of the type of photodetector element include a photoconductor-type photodetector element and a photodiode-type photodetector element. Among the above, a photodiode-type photodetector element is preferable due to the reason that a high signal-to-noise ratio (SN ratio) is easily obtained.

FIG. 1 illustrates an embodiment of a photodiode-type photodetector element. It is noted that an arrow in the figure represents the incidence ray on the photodetector element. A photodetector element 1 illustrated in FIG. 1 includes a lower electrode 12, an upper electrode 11 opposite to the lower electrode 12, and a photoelectric conversion layer 13 provided between the lower electrode 12 and the upper electrode 11. The photodetector element 1 illustrated in FIG. 1 is used by causing light to be incident from above the upper electrode 11.

The photoelectric conversion layer 13 is the photoelectric conversion layer according to the embodiment of the present invention described above. The preferred aspect of the photoelectric conversion layer is as described above.

In addition, a wavelength λ of the target light to be detected by the photodetector element and an optical path length $L^\lambda$ of the light having the wavelength λ from a surface 12a of the lower electrode 12 on a side of the photoelectric conversion layer 13 to a surface 13a of the photoelectric conversion layer 13 on a side of the upper electrode layer preferably satisfy the relationship of Expression (1-1), and more preferably satisfy the relationship of Expression (1-2). In a case where the wavelength λ and the optical path length $L^\lambda$ satisfy such a relationship, in the photoelectric conversion layer 13, it is possible to arrange a phase of the light (the incidence ray) incident from the side of the upper electrode 11 and a phase of the light (the reflected light) reflected on the surface of the lower electrode 12, and as a result, the light is intensified by the optical interference effect, whereby it is possible to obtain a higher external quantum efficiency.

$$0.05 + m/2 \leq L^\lambda/\lambda \leq 0.35 + m/2 \quad (1\text{-}1)$$

$$0.10 + m/2 \leq L^\lambda/\lambda \leq 0.30 + m/2 \quad (1\text{-}2)$$

In the above expressions, λ is the wavelength of the target light to be detected by the photodetector element, $L^\lambda$ is the optical path length of light having a wavelength λ from a surface 12a of the lower electrode 12 on a side of the photoelectric conversion layer 13 to a surface 13a of the photoelectric conversion layer 13 on a side of the upper electrode layer, and m is an integer of 0 or more.

m is preferably an integer of 0 to 4, more preferably an integer of 0 to 3, and still more preferably an integer of 0 to 2. According to this aspect, the transport characteristics of charges such as the hole and the electron are good, and thus it is possible to increase the external quantum efficiency of the photodetector element.

Here, the optical path length means the product obtained by multiplying the physical thickness of a substance through which light transmits by the refractive index. To describe with the photoelectric conversion layer 13 as an example, in a case where the thickness of the photoelectric conversion layer is denoted by $d^1$ and the refractive index of the photoelectric conversion layer with respect to the wavelength $\lambda^1$ is denoted by $N^1$, the optical path length of the light having a wavelength $\lambda^1$ and transmitting through the photoelectric conversion layer 13 is $N^1 \times d^1$. In a case where the photoelectric conversion layer 13 is composed of two or more laminated films or in a case where an interlayer described later is present between the photoelectric conversion layer 13 and the lower electrode 12, the integrated value of the optical path length of each layer is the optical path length $L^\lambda$.

The upper electrode 11 is preferably a transparent electrode formed of a conductive material that is substantially transparent with respect to the wavelength of the target light to be detected by the photodetector element. It is noted that in the present invention, the description of "substantially transparent" means that the transmittance is 50% or more, preferably 60% or more, and particularly preferably 80% or more. Examples of the material of the upper electrode 11 include a conductive metal oxide. Specific examples thereof include tin oxide, zinc oxide, indium oxide, indium tungsten oxide, indium zinc oxide (IZO), indium tin oxide (ITO), and a fluorine-doped tin oxide (FTO).

The film thickness of the upper electrode 11 is not particularly limited, and it is preferably 0.01 to 100 more preferably 0.01 to 10 and particularly preferably 0.01 to 1 μm. It is noted that in the present invention, the thickness of each layer can be measured by observing the cross section of the photodetector element 1 using a scanning electron microscope (SEM) or the like.

Examples of the material that forms the lower electrode 12 include a metal such as platinum, gold, nickel, copper, silver, indium, ruthenium, palladium, rhodium, iridium, osmium, or aluminum, the above-described conductive metal oxide, a carbon material, and a conductive polymer. The carbon material may be any material having conductivity, and examples thereof include fullerene, a carbon nanotube, graphite, and graphene.

The lower electrode 12 is preferably a thin film of a metal or conductive metal oxide (including a thin film formed by vapor deposition), or a glass substrate or plastic substrate having this thin film. The glass substrate or the plastic substrate is preferably glass having a thin film of gold or platinum, or glass on which platinum is vapor-deposited. The film thickness of the lower electrode 12 is not particularly limited, and it is preferably 0.01 to 100 μm, more preferably 0.01 to 10 μm, and particularly preferably 0.01 to 1 μm.

Although not illustrated in the drawing, a transparent substrate may be arranged on the surface of the upper electrode 11 on the light incident side (the surface opposite to the side of the photoelectric conversion layer 13). Examples of the kind of transparent substrate include a glass substrate, a resin substrate, and a ceramic substrate.

In addition, although not illustrated in the drawing, an interlayer may be provided between the photoelectric conversion layer 13 and the lower electrode 12 and/or between the photoelectric conversion layer 13 and the upper electrode 11. Examples of the interlayer include a blocking layer, an electron transport layer, and a hole transport layer. Examples of the preferred aspect thereof include an aspect in which the hole transport layer is provided at any one of gap between the photoelectric conversion layer 13 and the lower electrode 12 or a gap between the photoelectric conversion layer 13 and the upper electrode 11. It is more preferable that the electron transport layer is provided at any one of a gap between the photoelectric conversion layer 13 and the lower electrode 12 or a gap between the photoelectric conversion layer 13 and the upper electrode 11, and the hole transport layer is provided at the other gap. The hole transport layer and the electron transport layer may be a single-layer film or a laminated film having two or more layers.

The blocking layer is a layer having a function of preventing a reverse current. The blocking layer is also called a short circuit prevention layer. Examples of the material that forms the blocking layer include silicon oxide, magnesium oxide, aluminum oxide, calcium carbonate, cesium carbonate, polyvinyl alcohol, polyurethane, titanium oxide, tin oxide, zinc oxide, niobium oxide, and tungsten oxide. The blocking layer may be a single-layer film or a laminated film having two or more layers.

The electron transport layer is a layer having a function of transporting electrons generated in the photoelectric conversion layer 13 to the upper electrode 11 or the lower electrode 12. The electron transport layer is also called a hole block layer. The electron transport layer is formed of an electron transport material capable of exhibiting this function. Examples of the electron transport material include a fullerene compound such as [6,6]-phenyl-C61-butyric acid methyl ester ($PC_{61}BM$), a perylene compound such as perylenetetracarboxylic diimide, tetracyanoquinodimethane, titanium oxide, tin oxide, zinc oxide, indium oxide, indium tungsten oxide, indium zinc oxide, indium tin oxide, and fluorine-doped tin oxide. The electron transport layer may be a single-layer film or a laminated film having two or more layers.

The hole transport layer is a layer having a function of transporting holes generated in the photoelectric conversion layer 13 to the upper electrode 11 or the lower electrode 12. The hole transport layer is also called an electron block layer. The hole transport layer is formed of a hole transport material capable of exhibiting this function. Examples of the hole transport material include PEDOT:PSS (poly(3,4-ethylenedioxythiophene):poly(4-styrenesulfonic acid)) and $MoO_3$. In addition, the organic hole transport material disclosed in paragraph Nos. 0209 to 0212 of JP2001-291534A can also be used. In addition, a semiconductor quantum dot can also be used as the hole transport material. Examples of the semiconductor quantum dot material that constitutes the semiconductor quantum dot include a nano particle (a particle having a size of 0.5 nm or more and less than 100 nm) of a general semiconductor crystal [a) a Group IV semiconductor, b) a compound semiconductor of a Group IV to IV element, a Group III to V element, or a Group II to VI element, or c) a compound semiconductor consisting of a combination of three or more of a Group II element, a Group III element, a Group IV element, a Group V element, and a Group VI element].

Specific examples thereof include semiconductor materials having a relatively narrow band gap, such as PbS, Pb Se, InN, InAs, Ge, InAs, InGaAs, CuInS, CuInSe, CuInGaSe, InSb, Si, and InP. A ligand may be coordinated on the surface of the semiconductor quantum dot. Examples of the ligand include the above-described polydentate ligand.

<Image Sensor>

The image sensor according to the embodiment of the present invention includes the above-described photodetector element according to the embodiment of the present invention. The configuration of the image sensor is not particularly limited as long as it has the photodetector element according to the embodiment of the present invention and it is a configuration that functions as an image sensor.

The image sensor according to the embodiment of the present invention may include an infrared transmission filter layer. The infrared transmission filter layer preferably has a low light transmittance in the wavelength range of the visible region, more preferably has an average light transmittance of 10% or less, still more preferably 7.5% or less, and particularly preferably 5% or less in a wavelength range of 400 to 650 nm.

Examples of the infrared transmission filter layer include those composed of a resin film containing a coloring material. Examples of the coloring material include a chromatic coloring material such as a red coloring material, a green coloring material, a blue coloring material, a yellow coloring material, a purple coloring material, and an orange coloring material, and a black coloring material. It is preferable that the coloring material contained in the infrared transmission filter layer forms a black color with a combination of two or more kinds of chromatic coloring materials or a coloring material containing a black coloring material. Examples of the combination of the chromatic coloring material in a case of forming a black color by a combination of two or more kinds of chromatic coloring materials include the following aspects (C1) to (C7).

(C1) an aspect containing a red coloring material and a blue coloring material.

(C2) an aspect containing a red coloring material, a blue coloring material, and a yellow coloring material.

(C3) an aspect containing a red coloring material, a blue coloring material, a yellow coloring material, and a purple coloring material.

(C4) an aspect containing a red coloring material, a blue coloring material, a yellow coloring material, a purple coloring material, and a green coloring material.

(C5) an aspect containing a red coloring material, a blue coloring material, a yellow coloring material, and a green coloring material.

(C6) an aspect containing a red coloring material, a blue coloring material, and a green coloring material.

(C7) an aspect containing a yellow coloring material and a purple coloring material.

The chromatic coloring material may be a pigment or a dye. The infrared transmission filter layer may contain a pigment and a dye. The black coloring material is preferably an organic black coloring material. Examples of the organic black coloring material include a bisbenzofuranone compound, an azomethine compound, a perylene compound, and an azo compound.

The infrared transmission filter layer may further contain an infrared absorber. In a case where the infrared absorber is contained in the infrared transmission filter layer, the wavelength of the light to be transmitted can be shifted to the longer wavelength side. Examples of the infrared absorber include a pyrrolo pyrrole compound, a cyanine compound, a squarylium compound, a phthalocyanine compound, a naphthalocyanine compound, a quaterrylene compound, a merocyanine compound, a croconium compound, an oxonol compound, an iminium compound, a dithiol compound, a triarylmethane compound, a pyrromethene compound, an azomethine compound, an anthraquinone compound, a dibenzofuranone compound, a dithiolene metal complex, a metal oxide, and a metal boride.

The spectral characteristics of the infrared transmission filter layer can be appropriately selected according to the use application of the image sensor. Examples of the filter layer include those that satisfy any one of the following spectral characteristics of (1) to (5).

(1): A filter layer in which the maximum value of the light transmittance in the film thickness direction in a wavelength range of 400 to 750 nm is 20% or less (preferably 15% or less and more preferably 10% or less), and the minimum value of the light transmittance in the film thickness direction in a wavelength range of 900 to 1,500 nm is 70% or more (preferably 75% or more and more preferably 80% or more).

(2): A filter layer in which the maximum value of the light transmittance in the film thickness direction in a wavelength range of 400 to 830 nm is 20% or less (preferably 15% or less and more preferably 10% or less), and the minimum value of the light transmittance in the film thickness direction in a wavelength range of 1,000 to 1,500 nm is 70% or more (preferably 75% or more and more preferably 80% or more).

(3): A filter layer in which the maximum value of the light transmittance in the film thickness direction in a wavelength range of 400 to 950 nm is 20% or less (preferably 15% or less and more preferably 10% or less), and the minimum value of the light transmittance in the film thickness direction in a wavelength range of 1,100 to 1,500 nm is 70% or more (preferably 75% or more and more preferably 80% or more).

(4): A filter layer in which the maximum value of the light transmittance in the film thickness direction in a wavelength range of 400 to 1,100 nm is 20% or less (preferably 15% or less and more preferably 10% or less), and the minimum value thereof in a wavelength range of 1,400 to 1,500 nm is 70% or more (preferably 75% or more and more preferably 80% or more).

(5): A filter layer in which the maximum value of the light transmittance in the film thickness direction in a wavelength range of 400 to 1,300 nm is 20% or less (preferably 15% or less and more preferably 10% or less), and the minimum value thereof in a wavelength range of 1,600 to 2,000 nm is 70% or more (preferably 75% or more and more preferably 80% or more).

Further, as the infrared transmission filter, the films disclosed in JP2013-077009A, JP2014-130173A, JP2014-130338A, WO2015/166779A, WO2016/178346A, WO2016/190162A, WO2018/016232A, JP2016-177079A, JP2014-130332A, and WO2016/027798A can be used. In addition, as the infrared transmission filter, two or more filters may be used in combination, or a dual bandpass filter that transmits through two or more specific wavelength regions with one filter may be used.

The image sensor according to the embodiment of the present invention may include an infrared shielding filter for the intended purpose of improving various performances such as noise reduction. Specific examples of the infrared shielding filter include the filters disclosed in WO2016/186050A, WO2016/035695A, JP6248945B, WO2019/021767A, JP2017-067963A, and JP6506529B.

The image sensor according to the embodiment of the present invention may include a dielectric multi-layer film. Examples of the dielectric multi-layer film include those in which a plurality of layers are laminated by alternately laminating a dielectric thin film having a high refractive index (a high refractive index material layer) and a dielectric thin film having a low refractive index (a low refractive index material layer). The number of laminated layers of the dielectric thin film in the dielectric multi-layer film is not particularly limited; however, it is preferably 2 to 100 layers, more preferably 4 to 60 layers, and still more preferably 6 to 40 layers. The material that is used for forming the high refractive index material layer is preferably a material having a refractive index of 1.7 to 2.5. Specific examples thereof include $Sb_2O_3$, $Sb_2S_3$, $Bi_2O_3$, $CeO_2$, $CeF_3$, $HfO_2$, $La_2O_3$, $Nd_2O_3$, $Pr_6O_{11}$, $Sc_2O_3$, $SiO$, $Ta_2O_5$, $TiO_2$, $TlCl$, $Y_2O_3$, $ZnSe$, $ZnS$, and $ZrO_2$. The material that is used for forming the low refractive index material layer is preferably a material having a refractive index of 1.2 to 1.6. Specific examples thereof include $Al_2O_3$, $BiF_3$, $CaF_2$, $LaF_3$, $PbCl_2$, $PbF_2$, $LiF$, $MgF_2$, $MgO$, $NdF_3$, $SiO_2$, $Si_2O_3$, $NaF$, $ThO_2$, $ThF_4$, and $Na_3AlF_6$. The method for forming the dielectric multi-layer film is not particularly limited; however, examples thereof include ion plating, a vacuum deposition method using an ion beam or the like, a physical vapor deposition method (a PVD method) such as sputtering, and a chemical vapor deposition method (a CVD method). The thickness of each of the high refractive index material layer and the low refractive index material layer is preferably $0.1\lambda$ to $0.5\lambda$ in a case where the wavelength of the light to be blocked is $\lambda$ (nm). Specific examples of the dielectric multi-layer film include the dielectric multi-layer films disclosed in JP2014-130344A and JP2018-010296A.

In the dielectric multi-layer film, the transmission wavelength range is preferably present in the infrared region (preferably a wavelength range having a wavelength of more than 700 nm, more preferably a wavelength range having a wavelength of more than 800 nm, and still more preferably a wavelength range having a wavelength of more than 900 nm). The maximum transmittance in the transmission wavelength range is preferably 70% or more, more preferably 80% or more, and still more preferably 90% or more. In addition, the maximum transmittance in the shielding wavelength range is preferably 20% or less, more preferably 10% or less, and still more preferably 5% or less. In addition, the average transmittance in the transmission wavelength range is preferably 60% or more, more preferably 70% or more, and still more preferably 80% or more. In addition, in a case where the wavelength at which the maximum transmittance is exhibited is denoted by a central wavelength $\lambda_{t1}$, the wavelength range of the transmission wavelength range is preferably "the central wavelength $\lambda_{t1} \pm 100$ nm", more preferably "the central wavelength $\lambda_{t1} \pm 75$ nm", and still more preferably "the central wavelength $\lambda_{t1} \pm 50$ nm".

The dielectric multi-layer film may have only one transmission wavelength range (preferably, a transmission wavelength range having a maximum transmittance of 90% or more) or may have a plurality of transmission wavelength ranges.

The image sensor according to the embodiment of the present invention may include a color separation filter layer. Examples of the color separation filter layer include a filter layer including colored pixels. Examples of the kind of colored pixel include a red pixel, a green pixel, a blue pixel, a yellow pixel, a cyan pixel, and a magenta pixel. The color separation filter layer may include colored pixels having two or more colors or having only one color. It can be appropriately selected according to the use application and the intended purpose. As the color separation filter layer, for example, the filter disclosed in WO2019/039172A can be used.

In addition, in a case where the color separation layer includes colored pixels having two or more colors, the colored pixels of the respective colors may be adjacent to each other, or a partition wall may be provided between the respective colored pixels. The material of the partition wall is not particularly limited. Examples thereof include an organic material such as a siloxane resin or a fluororesin, and an inorganic particle such as a silica particle. In addition, the partition wall may be composed of a metal such as tungsten or aluminum.

In a case where the image sensor according to the embodiment of the present invention includes an infrared transmission filter layer and a color separation layer, it is preferable that the color separation layer is provided on an optical path different from the infrared transmission filter layer. In addition, it is also preferable that the infrared transmission filter layer and the color separation layer are arranged two-dimensionally. The fact that the infrared transmission filter layer and the color separation layer are two-dimensionally arranged means that at least a part of both is present on the same plane.

The image sensor according to the embodiment of the present invention may include an interlayer such as a planarizing layer, an underlying layer, or an intimate attachment layer, an anti-reflection film, and a lens. As the anti-reflection film, for example, a film prepared from the composition disclosed in WO2019/017280A can be used. As the lens, for example, the structure disclosed in WO2018/092600A can be used.

The photodetector element according to the embodiment of the present invention also has excellent sensitivity to light having a wavelength in the infrared region. As a result, the image sensor according to the embodiment of the present invention can be preferably used as an infrared image sensor. In addition, the image sensor according to the embodiment of the present invention can be preferably used as a sensor that senses light having a wavelength of 900 to 2,000 nm and can be more preferably used as a sensor that senses light having a wavelength of 900 to 1,600 nm.

<Dispersion Liquid>

The dispersion liquid according to the embodiment of the present invention contains PbS quantum dots that contain more than 0 mol and 1.40 mol or less of a Pb atom with respect to 1 mol of a S atom; a ligand that is coordinated to the PbS quantum dot; and a solvent.

The PbS quantum dot that is used in the dispersion liquid has the same meaning as the PbS quantum dot described in the section of the photodetector element. The content of the PbS quantum dot in the dispersion liquid is preferably 1 to 500 mg/mL, more preferably 10 to 200 mg/mL, and still more preferably 20 to 100 mg/mL.

Examples of the solvent that is used in the dispersion liquid include those described as the solvent contained in the above-described dispersion liquid and the ligand solution. The content of the solvent in the dispersion liquid is preferably 50% to 99% by mass, more preferably 70% to 99% by mass, and still more preferably 90% to 98% by mass, with respect to the total mass of the dispersion liquid.

The ligand contained in the dispersion liquid acts as a ligand that is coordinated to the PbS quantum dot and has a molecular structure that easily causes steric hindrance, and thus it is preferable that the dispersion liquid also serves as a dispersing agent that disperses PbS quantum dots in the solvent. From the viewpoint of improving the dispersibility of PbS quantum dots, the ligand is preferably a ligand having at least 6 or more carbon atoms in the main chain and is more preferably a ligand having 10 or more carbon atoms in the main chain. The ligand may be any one of a saturated compound or an unsaturated compound. Specific examples of the ligand include decanoic acid, lauric acid, myristic acid, palmitic acid, stearic acid, behenic acid, oleic acid, erucic acid, oleyl amine, dodecyl amine, dodecanethiol, 1,2-hexadecanethiol, trioctylphosphine oxide, and cetrimonium bromide. The ligand is preferably one that hardly remains in the film after the formation of the semiconductor film. Specifically, it is preferable that the molecular weight thereof is small. The ligand is preferably oleic acid or oleyl amine from the viewpoint of imparting the dispersion stability to the PbS quantum dots and hardly remaining on the semiconductor film. In addition, the ligand contained in the dispersion liquid may be the ligand containing a halogen atom, described in the section of the photodetector element; a polydentate ligand containing two or more coordination moieties; or the like. The content of the ligand in the dispersion liquid is preferably 0.1 mmol/L to 200 mmol/L and more preferably 0.5 mmol/L to 10 mmol/L with respect to the total volume of the dispersion liquid.

<Semiconductor Film>

The semiconductor film according to the embodiment of the present invention is a semiconductor film containing aggregates of PbS quantum dots; and a ligand that is coordinated to the PbS quantum dot, in which the PbS quantum dot contains more than 0 mol and 1.40 mol or less of a Pb atom with respect to 1 mol of a S atom. The PbS quantum dot preferably contains 0.95 mol or more and 1.40 mol or less of a Pb atom with respect to 1 mol of a S atom. The PbS quantum dot has the same meaning as the PbS quantum dot described in the section of the photodetector element. Examples of the ligand that is coordinated to the PbS quantum dot include the ligand containing a halogen atom, described in the section of the photodetector element; a polydentate ligand containing two or more coordination moieties; or the like. The same applies to the preferred range. The semiconductor film according to the embodiment of the present invention is preferably used in a photoelectric conversion layer of a photodetector element, or the like.

EXAMPLES

Hereinafter, the present invention will be described more specifically with reference to Examples. Materials, amounts used, proportions, treatment details, treatment procedures, and the like shown in the following examples can be appropriately changed without departing from the gist of the present invention. Accordingly, a scope of the present invention is not limited to the following specific examples.

[Evaluation Method for Pb/S Ratio (Molar Ratio) of PbS Quantum Dot]

A dispersion liquid of PbS quantum dots was concentrated to 60 mg/mL, 50 µL thereof was collected, 5 mL of nitric acid was added, and then the sample was decomposed by heating to 230° C. with a microwave. After adding water thereto to make the total volume 40 mL, the Pb atom and the S atom in the PbS quantum dot were quantified using an inductively coupled plasma (ICP) emission spectroscopic analysis apparatus (Optima 7300DV manufactured by PerkinElmer, Inc.), and the Pb/S ratio (molar ratio) of the PbS quantum dot was quantified.

Example 1

8.25 mL of oleic acid, 11 mmol of lead oxide, and 24 mL of octadecene were weighed and taken in a flask and heated at 150° C. under vacuum for 100 minutes to obtain a precursor solution. Then, the system was made into a nitrogen flow state, and then 20 mmol of sulfur was injected together with 20 mL trioctylphosphine. After the injection, the flask was cooled in air, and at the stage where the temperature reached 30° C., 40 mL of toluene was added thereto, and a solution was recovered. An excess amount of ethanol was added to the solution, centrifugation was carried out at 10,000 rpm for 10 minutes, and the precipitate was dispersed in octane, to obtain a dispersion liquid (concentration: 10 mg/mL) of PbS quantum dots, in which oleic acid was coordinated as a ligand on the surface of the PbS quantum dot. The band gap of the PbS quantum dot in the obtained dispersion liquid of PbS quantum dot was estimated from light absorption measurement in the visible to infrared region by using an ultraviolet-visible-near-infrared spectrophotometer (V-670, manufactured by JASCO Corporation), and it was approximately 1.32 eV. In addition, as a result of calculating the Pb/S ratio (molar ratio) of the PbS quantum dot was by the above method, the Pb/S ratio (molar ratio) of the PbS quantum dot was 1.40.

The obtained dispersion liquid of PbS quantum dots was used to prepare a photodiode-type photodetector element by the following method.

First, a titanium oxide film of 50 nm was formed by sputtering on a quartz glass substrate attached with a fluorine-doped tin oxide film. Next, the dispersion liquid of PbS quantum dots was added dropwise onto the titanium oxide film formed on the substrate, and spin coating was carried out at 2,500 rpm to form a PbS quantum dot aggregate film (a step 1). Next, a methanol solution (concentration: 0.1 mol/L) of 3-mercaptopropionic acid as the ligand solution was added dropwise onto the PbS quantum dot aggregate film, allowed to stand for 1 minute, and spin drying was carried out at 2,500 rpm. Next, methanol was added dropwise onto the PbS quantum dot aggregate film, and spin drying was carried at 2,500 rpm for 20 seconds to carry out the ligand exchange of the ligand coordinated to the PbS quantum dot from oleic acid to 3-mercaptopropionic acid (a step 2). The operation of the step 1 and step 2 as one cycle was repeated for 30 cycles, and a photoelectric conversion layer, which is the PbS quantum dot aggregate film in which the ligand is exchanged from oleic acid to mercaptopropionic acid, was formed to a thickness of 100 nm. Next, molybdenum oxide was formed to a thickness of 50 nm, and gold was formed to a thickness of 100 nm on the photoelectric conversion layer by continuous vapor deposition to obtain a photodiode-type photodetector element.

Example 2

A dispersion liquid (concentration: 10 mg/mL) of PbS quantum dots, in which oleic acid was coordinated as a ligand on the surface of the PbS quantum dots, was obtained by the same method as in Example 1 except that 22 mmol of sulfur was used instead of 20 mmol of sulfur in Example 1. The band gap of the obtained PbS quantum dot was approximately 1.32 eV. In addition, the Pb/S ratio (molar ratio) of the PbS quantum dot was 1.20. This dispersion liquid of PbS quantum dots was used to prepare a photodiode-type photodetector element by the same method as in Example 1.

Example 3

A dispersion liquid (concentration: 10 mg/mL) of PbS quantum dots, in which oleic acid was coordinated as a ligand on the surface of PbS quantum dots, was obtained by the same method as in Example 1 except that 24 mmol of sulfur was used instead of 20 mmol of sulfur in Example 1. The band gap of the obtained PbS quantum dot was approximately 1.32 eV. In addition, the Pb/S ratio (molar ratio) of the PbS quantum dot was 0.95. This dispersion liquid of PbS quantum dots was used to prepare a photodiode-type photodetector element by the same method as in Example 1.

Example 4

A dispersion liquid (concentration: 10 mg/mL) of PbS quantum dots, in which oleic acid was coordinated as a ligand on the surface of PbS quantum dots, was obtained by the same method as in Example 1 except that 24.5 mmol of sulfur was used instead of 20 mmol of sulfur in Example 1. The band gap of the obtained PbS quantum dot was approximately 1.32 eV. In addition, the Pb/S ratio (molar ratio) of the PbS quantum dot was 0.90. This dispersion liquid of PbS quantum dots was used to prepare a photodiode-type photodetector element by the same method as in Example 1.

Comparative Example 1

As the dispersion liquid of PbS quantum dots, a commercially available dispersion liquid (manufactured by Sigma-Aldrich Co., LLC, product number: 900735) of PbS quantum dots was used. The band gap thereof estimated from the absorption measurement of the dispersion liquid of the PbS quantum dots was about 1.32 eV. In addition, as a result of calculating the Pb/S ratio (molar ratio) of the PbS quantum dot was by the above method, the Pb/S ratio (molar ratio) of the PbS quantum dot was 1.60. This dispersion liquid of PbS quantum dots was used to prepare a photodetector element by the same method as in Example 1.

<Evaluation>

The external quantum efficiency and the dark current density were calculated when each photodetector element was irradiated with monochrome light (100 μW/cm$^2$) having a wavelength of 940 nm in a state where a reverse voltage of 2 V was applied thereto. The external quantum efficiency was estimated by "external quantum efficiency=(number of photoelectrons/number of irradiated photons)×100" from the number of photoelectrons estimated from the difference between a current value in a case of not being irradiated with light and a current value in a case of being irradiated with light, and the number of irradiated photons.

The dark current density was estimated from the current value in a case of not being irradiated with light and the light irradiation area.

TABLE 1

| | Pb/S ratio of PbS quantom dot (molar ratio) | Kind of ligand | External quantum efficiency [%] | Dark current density [A/cm$^2$] |
|---|---|---|---|---|
| Example 1 | 1.40 | 3-mercaptopropionic acid | 12 | $1.8 \times 10^{-7}$ |
| Example 2 | 1.20 | 3-mercaptopropionic acid | 12 | $1.8 \times 10^{-7}$ |
| Example 3 | 0.95 | 3-mercaptopropionic acid | 12 | $1.6 \times 10^{-7}$ |
| Example 4 | 0.90 | 3-mercaptopropionic acid | 12 | $3.3 \times 10^{-7}$ |
| Comparative Example 1 | 1.60 | 3-mercaptopropionic acid | 13 | $1.9 \times 10^{-6}$ |

As shown in the above table, it was confirmed that in the photodetector element of Example, the external quantum efficiency is almost the same as that of Comparative Example, and the dark current density is reduced by about one order of magnitude as compared Comparative Example.

Example 5

A photodetector element was prepared by the same method as in Example 3 except that a methanol solution of 2-aminoethanol (concentration: 0.1 mol/L) was used as the ligand solution instead of the methanol solution of 3-mercaptopropionic acid (concentration: 0.1 mol/L). As a result of measuring the dark current density of the obtained photodetector element by the above method, the dark current density was $3.1 \times 10^{-7}$ A/cm$^2$.

Example 6

A photodetector element was prepared by the same method as in Example 3 except that a methanol solution of thioglycolic acid (concentration: 0.1 mol/L) was used as the ligand solution instead of the methanol solution of 3-mercaptopropionic acid (concentration: 0.1 mol/L). As a result of measuring the dark current density of the obtained photodetector element by the above method, the dark current density was $3.9 \times 10^{-7}$ A/cm$^2$.

Example 7

A photodetector element was prepared by the same method as in Example 3 except that a methanol solution of zinc iodide (concentration: 0.025 mol/L) was used as the ligand solution instead of the methanol solution of 3-mercaptopropionic acid (concentration: 0.1 mol/L). As a result of measuring the dark current density of the obtained photodetector element by the above method, the dark current density was $1.5 \times 10^{-7}$ A/cm$^2$.

Example 8

A photodetector element was prepared by the same method as in Example 3 except that a methanol solution of zinc bromide (concentration: 0.025 mol/L) was used as the ligand solution instead of the methanol solution of 3-mercaptopropionic acid (concentration: 0.1 mol/L). As a result of measuring the dark current density of the obtained photodetector element by the above method, the dark current density was $1.4 \times 10^{-7}$ A/cm$^2$.

Example 9

A photodetector element was prepared by the same method as in Example 3 except that a methanol solution of indium iodide (concentration: 0.025 mol/L) was used as the ligand solution instead of the methanol solution of 3-mercaptopropionic acid (concentration: 0.1 mol/L). As a result of measuring the dark current density of the obtained photodetector element by the above method, the dark current density was $1.2 \times 10^{-7}$ A/cm$^2$.

Examples 10 to 14

Photodetector elements were prepared by the same methods as in Examples 5 to 9 except that the quantum dot was changed to a PbS quantum dot having a Pb/S ratio (molar ratio) of 1.20, described in Example 2 instead of the PbS quantum dot having a Pb/S ratio (molar ratio) of 0.95. Table 2 shows the dark current density of the obtained photodetector element.

Example 15

A photodetector element was prepared by the same method as in Example 10 except that a methanol solution (concentration of 3-mercaptopropionic acid: 0.01 mol/L, concentration of zinc iodide: 0.025 mol/L) containing 3-mercaptopropionic acid and zinc iodide was used as the ligand solution. Table 2 shows the dark current density of the obtained photodetector element.

TABLE 2

| | Pb/S ratio of PbS quantum dot (molar ratio) | Kind of ligand | Dark current density [A/cm$^2$] |
|---|---|---|---|
| Example 5 | 0.95 | 2-aminoethanol | $3.1 \times 10^{-7}$ |
| Example 6 | 0.95 | Thioglycolic acid | $3.9 \times 10^{-7}$ |
| Example 7 | 0.95 | Zinc iodide | $1.5 \times 10^{-7}$ |
| Example 8 | 0.95 | Zinc bromide | $1.4 \times 10^{-7}$ |
| Example 9 | 0.95 | Indium iodide | $1.2 \times 10^{-7}$ |
| Example 10 | 1.20 | 2-aminoethanol | $3.6 \times 10^{-7}$ |
| Example 11 | 1.20 | Thioglycolic acid | $3.8 \times 10^{-7}$ |
| Example 12 | 1.20 | Zinc iodide | $1.5 \times 10^{-7}$ |
| Example 13 | 1.20 | Zinc bromide | $1.5 \times 10^{-7}$ |
| Example 14 | 1.20 | Indium iodide | $1.3 \times 10^{-7}$ |
| Example 15 | 1.20 | 3-mercaptopropionic acid, Zinc iodide | $1.0 \times 10^{-7}$ |

It was confirmed that the dark current densities of the photodetector elements of Examples 5 to 15 are also reduced by about one order of magnitude as compared with Comparative Examples. In addition, the external quantum efficiencies of the photodetector elements of Examples 5 to 15 are almost the same as that of Example 1. As a result of comparing Example 5 and Example 6, the balance between the external quantum efficiency and the dark current density was excellent in Example 6. As a result of comparing Examples 7 to 9, the balance between the external quantum efficiency and the dark current density was most excellent in Example 7.

In a case where an image sensor is prepared by a known method by using the photodetector element obtained in Example described and incorporating it into a solid-state imaging element together with an optical filter prepared according to the methods disclosed in WO2016/186050A and WO2016/190162A, it is possible to obtain an image sensor having good visible and infrared imaging performance.

EXPLANATION OF REFERENCES

1: photodetector element
11: upper electrode
12: lower electrode
13: photoelectric conversion layer

What is claimed is:

1. A photodetector element comprising:
   a photoelectric conversion layer that contains aggregates of PbS quantum dots and a ligand that is coordinated to the PbS quantum dot,
   wherein the PbS quantum dot contains more than 0 mol and 1.40 mol or less of a Pb atom with respect to 1 mol of a S atom, and the photoelectric conversion layer has a thickness of 10 to 600 nm, and a refractive index of 2.0 to 3.0.

2. The photodetector element according to claim 1,
   wherein the PbS quantum dot contains 0.95 mol or more and 1.40 mol or less of the Pb atom with respect to 1 mol of the S atom.

3. The photodetector element according to claim 1,
   wherein the ligand contains at least one selected from a ligand containing a halogen atom or a polydentate ligand containing two or more coordination moieties.

4. The photodetector element according to claim 3,
   wherein the ligand containing a halogen atom is an inorganic halide.

5. The photodetector element according to claim 4,
   wherein the inorganic halide contains a Zn atom.

6. The photodetector element according to claim 3, wherein the ligand containing a halogen atom contains an iodine atom.

7. The photodetector element according to claim 1, wherein the ligand contains at least one selected from 3-mercaptopropionic acid, zinc iodide, zinc bromide, or indium iodide.

8. The photodetector element according to claim 1, wherein the ligand contains two or more kinds of ligands.

9. The photodetector element according to claim 1, wherein the ligand contains a ligand containing a halogen atom and a polydentate ligand containing two or more coordination moieties.

10. The photodetector element according to claim 1, wherein the photodetector element is a photodiode-type photodetector element.

11. A manufacturing method for the photodetector element according to claim 1, the manufacturing method comprising:
using a PbS quantum dot dispersion liquid that contains PbS quantum dots that contain more than 0 mol and 1.40 mol or less of a Pb atom with respect to 1 mol of a S atom, a ligand that is coordinated to the PbS quantum dot, and a solvent, to form a film of aggregates of PbS quantum dots.

12. An image sensor comprising the photodetector element according to claim 1.

13. The image sensor according to claim 12, wherein the image sensor senses light having a wavelength of 900 to 1,600 nm.

14. The image sensor according to claim 12, wherein the image sensor is an infrared image sensor.

15. A dispersion liquid for manufacturing the photodetector element of claim 1 comprising:
PbS quantum dots that contain more than 0 mol and 1.40 mol or less of a Pb atom with respect to 1 mol of a S atom;
a ligand that is coordinated to the PbS quantum dot; and
a solvent.

16. A semiconductor film for use in the photodetector element of claim 1 comprising:
aggregates of PbS quantum dots; and
a ligand that is coordinated to the PbS quantum dot,
wherein the PbS quantum dot contains more than 0 mol and 1.40 mol or less of a Pb atom with respect to 1 mol of a S atom.

17. The semiconductor film according to claim 16, wherein the PbS quantum dot contains 0.95 mol or more and 1.40 mol or less of the Pb atom with respect to 1 mol of the S atom.

18. A photodetector element of claim 1, wherein the ligand contains at least one selected from 2-aminoethanol, zinc bromide and indium iodide.

* * * * *